US006359494B2

United States Patent
Kanda et al.

(10) Patent No.: US 6,359,494 B2
(45) Date of Patent: Mar. 19, 2002

(54) SEMICONDUCTOR INTEGRATED CIRCUIT DEVICE HAVING AN OSCILLATION CIRCUIT USING REFERENCE CURRENT SOURCE INDEPENDENT FROM INFLUENCE OF VARIATION OF POWER SUPPLY VOLTAGE AND THRESHOLD VOLTAGE OF TRANSISTOR

(75) Inventors: Kazushige Kanda; Hiroshi Nakamura, both of Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/756,804

(22) Filed: Jan. 10, 2001

Related U.S. Application Data

(62) Division of application No. 09/061,064, filed on Apr. 16, 1998, now Pat. No. 6,201,434.

(30) Foreign Application Priority Data

Nov. 28, 1997 (JP) .............................. 9-328597

(51) Int. Cl.$^7$ ................................. H03L 5/00
(52) U.S. Cl. ..................... 327/333; 327/541; 323/316
(58) Field of Search ................. 327/108–112, 333, 327/538–543; 323/315, 316

(56) References Cited

U.S. PATENT DOCUMENTS 3,806,742 A 4/1974 Powell
4,882,533 A 11/1989 Kelley
5,543,746 A 8/1996 Kuo
5,627,488 A 5/1997 Tanzawa et al.
5,892,390 A 4/1999 Tobita

FOREIGN PATENT DOCUMENTS

JP 6-36584 2/1994

OTHER PUBLICATIONS

R.A. Cernea et al.: "A 1Mb Flash EEPROM," ISSCC Digest of Technical Papers, pp. 138–139, Feb. 16, 1989.

Primary Examiner—Kenneth B. Wells
(74) Attorney, Agent, or Firm—Banner & Witcoff, LTD

(57) ABSTRACT

According to the present invention, the semiconductor integrated circuit including the reference current generating circuit free from both the influence of a power supply voltage and the influence of the variation of the threshold voltage of the transistors related to the generation of the reference current. In the reference current generating circuit, a P-channel MOS transistor (Qp1), a N-channel MOS transistor (Qn1), a resistor element (R1), and a N-channel MOS transistor (Qn2) are connected in series between the power supply voltage and the ground. The gate and the drain of the N-channel MOS transistor (Qn2) are connected by a short circuit to output the reference current $I_{ref}$ from a transistor (Qn6) through the resistor element. The integrated circuit is provided with a level shifter connected to the reference current generating circuit such that the threshold voltages of the N-channel transistors (Qn1, Qn2) are added to a reference voltage $V_{ref}$ by N-channel transistors (Qn3, Qn4) in the level shifter, and the resultant reference voltage $V_{ref}$ is applied to the gate of the N-channel transistors (Qn1).

14 Claims, 8 Drawing Sheets

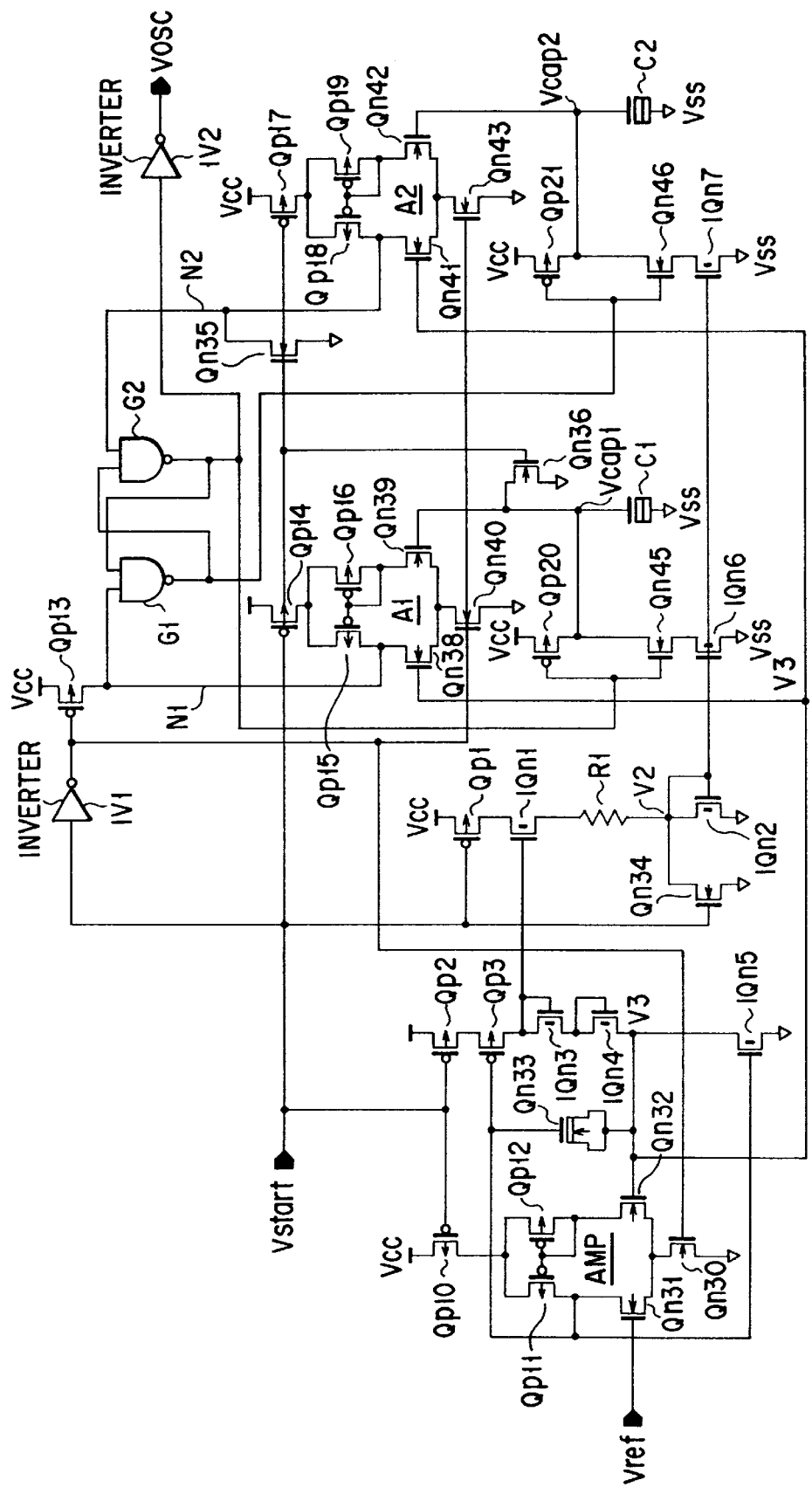
F I G. 6

SEMICONDUCTOR INTEGRATED CIRCUIT DEVICE HAVING AN OSCILLATION CIRCUIT USING REFERENCE CURRENT SOURCE INDEPENDENT FROM INFLUENCE OF VARIATION OF POWER SUPPLY VOLTAGE AND THRESHOLD VOLTAGE OF TRANSISTOR

This application is a divisional of prior application Ser. No. 09/061,064 filed Apr. 16, 1998, now U.S. Pat. No. 6,201,434.

BACKGROUND OF THE INVENTION

This invention relates to a semiconductor integrated circuit device which has a reference current generating circuit independent particularly from a power supply voltage Vcc.

FIG. 1 is a circuit diagram showing the conventional reference current generating circuit. In this circuit, a P-channel MOS transistor Qp1, a N-channel MOS transistor Qn1, a resistor R1, and a N-channel MOS transistor Qn2 are connected in series between a power supply voltage Vcc and a ground GND. The gate of the transistor Qp1 is supplied with a starting signal $V_{start}$ for controlling the circuit to turn from the stand-by state to the active state. The gate of the transistor Qn1 is applied with a reference voltage $V_{ref}$ generated by the external circuit. The gate of the transistor Qn2 is connected to a drain thereof so as to constitute a diode. The transistor Qn2 outputs an output $V_{out}$ from the gate to make a reference current $I_{ref}$ which is equal to the current flowing into Qn2 through the resistor R1, flow from a N-channel MOS transistor Qn6 (Qn6 has substantially the same characteristics and size as those of Qn2) which is connected to form a current mirror circuit with the transistor Qn2.

When the voltages at the both ends of the resistor R1 are respectively denoted as V1 and V2, the current value $I_{ref}$ is determined by the values of V1 and V2. In the circuit constituted as above, V1 depends on the reference voltage and the threshold voltage of the transistor Qn1, and V2 depends on the threshold voltage of the transistor Qn2. The potentials V1 and V2 are thus determined by the reference voltage $V_{ref}$ and the threshold voltages $V_{th}$ of the transistors Qn1 and Qn2, as represented by the following equations:

$$V1 = V_{ref} - V_{th}, V2 = V_{th} \quad (1)$$

Hence, the current value $I_{ref}$ is represented as follows:

$$I_{ref} = (V1-V2)/R1 = (V_{ref} - 2V_{th})/R1 \quad (2)$$

where R1 is the resistance value of the resistor R1.

As is clear from the above equation (2), the current value $I_{ref}$ is represented by the equation which does not include the term of the power supply voltage Vcc. The current value $I_{ref}$ is determined by the reference voltage $V_{ref}$, the threshold voltage $V_{th}$ of the transistors, and the resistance value R1. This circuit is thus independent from the influence of the power supply voltage Vcc.

FIG. 2 is a circuit diagram showing the constitution of the conventional oscillation circuit using the reference current generating circuit shown in FIG. 1. This circuit is basically the same as that disclosed in U.S. Pat. No. 5,627,488. The elements shown in FIG. 1 are denoted by the same reference numerals.

A capacitor C1 has one end connected selectively to either of the power supply voltage Vcc and the drain of the N-channel MOS transistor Qn6 in accordance with the level of the voltage of the common gate of a N-channel transistor Qn45 and a P-channel transistor Qp20. Similarly, a capacitor C2 has one end connected selectively to either of the power supply voltage Vcc and the drain of the N-channel MOS transistor Qn7 in accordance with the voltage level of the common gate of a N-channel transistor Qn46 and a P-channel transistor Qp21.

P-channel MOS transistors Qp14–Qp16 and N-channel MOS transistors Qn38–Qn40 constitute a first amplifier A1 for comparing the reference voltage $V_{ref}$ and the voltage $V_{cap1}$ at the one end of the capacitor C1 to amplify and output the difference thereof. Similarly, P-channel MOS transistors Qp17–Qp19 and N-channel MOS transistors Qn41–Qn43 constitute a second amplifier A2 for comparing the reference voltage $V_{ref}$ and the voltage $V_{cap2}$ at the one end of the capacitor C2 to amplify and output the difference thereof.

NAND gates G1 and G2 constitute an order logic circuit for outputting the order logic of the two amplifiers. In accordance with the output of the order logic circuit, the voltage level of the common gate of the transistor Qn45 and the transistor Qp20 and the voltage level of the common gate of the transistor Qn46 and the transistor Qp21 are alternately set at "H" (high level) and "L" (low level).

The operation of the oscillation circuit of FIG. 2 will be described below.

In a stand-by state, the signal $V_{start}$ is set at "H". In this time, the P-channel MOS transistors Qp1, Qp14, Qp17, and the N-channel MOS transistor Qn40 and Qn43 are turned off to shut the power supply system. While, the P-channel MOS transistor Qp13 and the N-channel MOS transistors Qn34, Qn35, and Qn36 are turned on, thereby the circuit is set at an initial state. In this time, the output from the NAND gate G2 is set at "H" and the output from the NAND gate G1 is set at "L". In accordance with the outputs from the NAND gates, the voltage $V_{cap1}$ of the one end of the capacitor C1 is set at "L", and the voltage $V_{cap2}$ of the one end of the capacitor C2 is set at "H". The output VOSC of the oscillation circuit is thus set at "L".

When the signal $V_{start}$ is turned from "H" to "L", the oscillation starts: the P-channel MOS transistor Qp13 and the N-channel MOS transistors Qn34, Qn35, and Qn36 are turned off, in contrast, the P-channel MOS transistors Qp1, Qp14, Qp17, and the N-channel MOS transistors Qn40 and Qn43 are turned on. In this time, the reference current generating circuit and the differential amplifiers A1 and A2 are set in the active state.

In the oscillation starting state, $V_{cap1}$ is set at "L" with respect to $V_{ref}$, and the differential amplifier A1 operates to drop the voltage level of a node N1. The output of the NAND gate G1 is thereby inverted to "H". In contrast, $V_{cap2}$ is set at "H" with respect to $V_{ref}$, and thus the other differential amplifier A2 operates to increase the voltage level of a node N2 to "H", and the output of the NAND gate G2 is inverted to "L" (in this time, the voltage level of the output signal VOSC of the oscillation circuit is set at "H").

When the NAND gate G1 outputs the signal at "H" level in the above-mentioned manner, the transistor Qn46 is turned on, thereby the capacitor C2 discharges the current $I_{ref}$ equal to the current flowing through the resistor R1 of the reference current generating circuit. Thus, the voltage level $V_{cap2}$ is dropped to a level lower than $V_{ref}$, and the potential level of the node N2 is thus dropped to invert the output of the NAND gate G2 to "H" (in this time, the voltage level of the output signal VOSC of the oscillation circuit is set at "L"). While, the NAND gate G2 outputs "L" to turn on the transistor Qp20, and the capacitor C1 is charged to the power supply voltage Vcc. The potential level $V_{cap1}$ of the capacitor C1 is thus increased to increase the potential level of the node N1.

In this manner, the levels of G1 and G2 are stabilized at "H" and "L", respectively, during a period from the time when $V_{cap2}$ is set at Vcc to the time when $V_{cap2}$ is dropped to $V_{ref}$.

When the NAND gate G2 outputs "H", the transistor Qn45 is turned on, and the capacitor C1 discharges the current $I_{ref}$ equal to the current flowing through the resistor R1 of the reference current generating circuit (in this time, the transistors Qn2, Qn6, and Qn7 have substantially the same characteristics and size). The voltage level $V_{cap1}$ of the capacitor C1 is dropped to a level lower than $V_{ref}$, and the potential level of the node N1 is dropped to invert the output of the NAND gate G1 to "H" (in this time, the voltage level of the output signal VOSC of the oscillation circuit is set at "H").

While, when the NAND gate G1 outputs "L", the transistor Qp21 is turned on, and the capacitor C2 is charged to the power supply voltage Vcc thereby. The potential level $V_{cap2}$ of the capacitor C2 is thus increased to increase the potential level of the node N2. As described above, the levels of G1 and G2 are stabilized at "L" and "H", respectively, during a period from the time when the $V_{cap1}$ is set at Vcc to the time when $V_{cap1}$ is dropped to $V_{ref}$. In this manner, the oscillation circuit performs the oscillation by repeating such two states alternatively.

The circuits shown in FIGS. 1 and 2, however, has the problems as described below.

As represented in the equation (2), the circuit shown in FIG. 1 is free from the influence of the power supply voltage. The circuit of FIG. 1, however, depends on the threshold voltages $V_{th}$ of the transistors Qn1 and Qn2, and thus the reference current is adversely affected by the variation of the threshold voltages of the transistors so much.

Assuming that the variation of the threshold voltage due to the variation generated in the manufacturing process of the transistors is $\Delta V_{th}$, the average value of the threshold voltage is $V_{th}$, the threshold voltage including the variation is $V_{th'}$, the relationship among them is represented as $V_{th'} = V_{th} + \Delta V_{th}$. In view of this relationship, the current value $I_{ref}$ is represented by the following equation:

$$I_{ref} = (V_{ref} - 2V_{th} - 2\Delta V_{th})/R1 \tag{3}$$

The proportion of variation $\Delta\Delta_{ref}$ of the current value $I_{ref}$ due to the variation $\Delta V_{th}$ of the threshold voltage to the current value $I_{ref}$ is represented as follows:

$$\Delta I_{ref}/I_{ref} = 2\Delta V_{th}/(V_{ref} - 2V_{th}) \tag{4}$$

When $V_{ref} = 2.4V$, $V_{th} = 0.7V$, and $\Delta V_{th} = 0.2V$, the rate of the variation of the current is 0.4/1.0=40%. As is clear from this, the reference current generating circuit shown in FIG. 1 cannot generate the current affected little by the variation of the threshold voltage.

In addition, the oscillation circuit shown in FIG. 2 uses the reference current generating circuit shown in FIG. 1 as a power supply with use of the reference voltage $V_{ref}$. In order to prevent he influence of the power supply, the reference voltage $V_{ref}$ is generally set within a scope from 1.0 to 1.5V. However, if $V_{ref}$ is decreased, the variation of the current value due to the variation of the threshold voltage will be increased, as represented in the equations (3) and (4). The reference current is deviated larger as $V_{ref}$ is decreased, even if the variation in the threshold voltage remains the same. In these days, the power supply voltage has been designed to be decreased. This problem therefore will not be ignored.

As described above, the current value $I_{ref}$ generated by the conventional reference current generating circuit is not affected by the power supply voltage, but is affected by the variation of the threshold voltages of the transistors in the circuit.

The operation of the oscillation circuit using such a reference current generating circuit is inevitably affected by the variation of the reference current value due to the variation of the threshold voltages. Further, even if the variation in the threshold voltage is not increased, the variation in the reference current value will be increased when the reference potential is decreased. Therefore, with such a reference current generating circuit, the reduction of the power supply voltage cannot be easily attained.

BRIEF SUMMARY OF THE INVENTION

The object of the present invention is to provide a semiconductor integrated circuit device having an oscillation circuit which uses a circuit for generating a stable reference current independently from not only the influence of the power supply voltage but also the influence of the variation of the threshold voltages of the transistors related to the generation of the reference current.

The object of the present invention is attained by the semiconductor integrated circuit device, comprising: a reference current generating circuit including a first MOS transistor having a gate connected to a node having a first potential, a second MOS transistor having a gate and a drain connected to each other so as to constitute a diode, the gate and the drain of the second MOS transistor being connected to a node having a second potential, and a resistor connected between a source of the first MOS transistor and the drain of the second MOS transistor; and a level shifter including a third MOS transistor applied with the first potential from a power supply through a load element, the third MOS transistor having a drain and a gate connected to each other so as to constitute a diode, the drain and the gate of the third MOS transistor being connected to the node having the first potential, and a fourth MOS transistor having a gate and a drain connected to the source of the third MOS transistor so as to constitute a diode and applied with a reference voltage at its own source, wherein the third and fourth MOS transistors of the level shifter comprise transistors, the total sum of the threshold voltages of which is substantially equal to that of the threshold voltages of the first and second MOS transistors of the reference current generating circuit, and the third and fourth MOS transistors generate the reference current in the resistor of the reference current generating circuit in accordance with a voltage applied to the gate of the first MOS transistor.

As one modification of the above-mentioned constitution, the level shifter may comprise the third MOS transistor applied with the first potential from a power supply through a P-channel transistor as a load element, and having a drain and a gate connected to each other so as to constitute a diode, the drain and the gate being connected to the node having the first potential; the fourth MOS transistor constituted as a diode, which has a gate and a drain connected to the source of the third MOS transistor and a source connected to a drain of a N-channel MOS transistor load element; and a differential amplifier for controlling the P-channel MOS transistor load element and the N-channel MOS transistor load element by outputting a difference between the reference voltage and a potential at the source of the fourth MOS transistor.

According to the present invention, drops of the threshold voltages of the first and second MOS transistors are added to the reference voltage by using the third and fourth MOS transistors, the drop of the threshold voltages of which are equal to that of the threshold voltages of the first and second MOS transistors. With this constitution, the variation of the threshold voltage of the transistors, which may affect the reference current independent from the influence of the power supply voltage, can be compensated.

In the present invention, the level shifter increases the reference voltage by adding thereto the threshold voltages of the third and fourth MOS transistors in the level shifter in order to compensate the drops of the threshold voltages of the first and second MOS transistors. The stable reference current independent from the influence of the variation of the threshold voltages thereby can be supplied to the oscillation circuit. Such a constitution is incorporated into a semiconductor integrated circuit device, e.g. a non-volatile semiconductor memory device, which includes a circuit for performing an oscillation circuit by using a reference current.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore and hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a circuit diagram showing the constitution of the oscillation circuit as a modification of the semiconductor integrated circuit device shown in FIG. 5, in which the constitution shown in FIG. 4 is used as a reference current source.

DETAILED DESCRIPTION OF THE INVENTION

Figure 1:
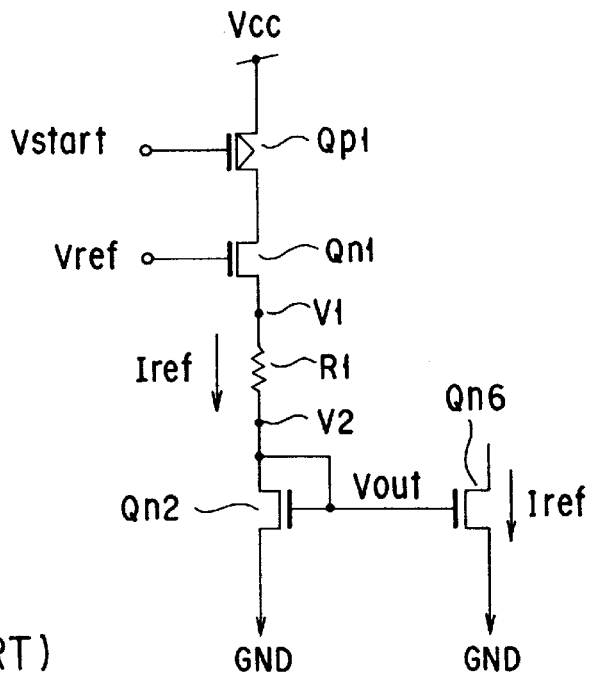
FIG. 1 is a circuit diagram showing the constitution of the conventional reference current generating circuit.
Figure 3:
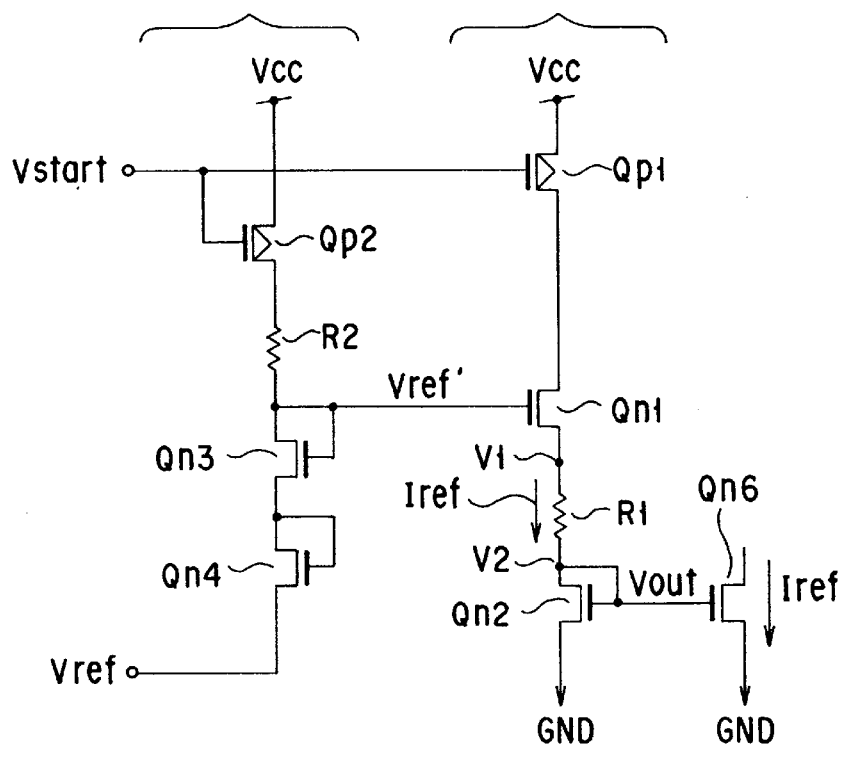
FIG. 3 is a circuit diagram showing the constitution of the reference current generating circuit according to the first embodiment of the present invention.
Figure 2:
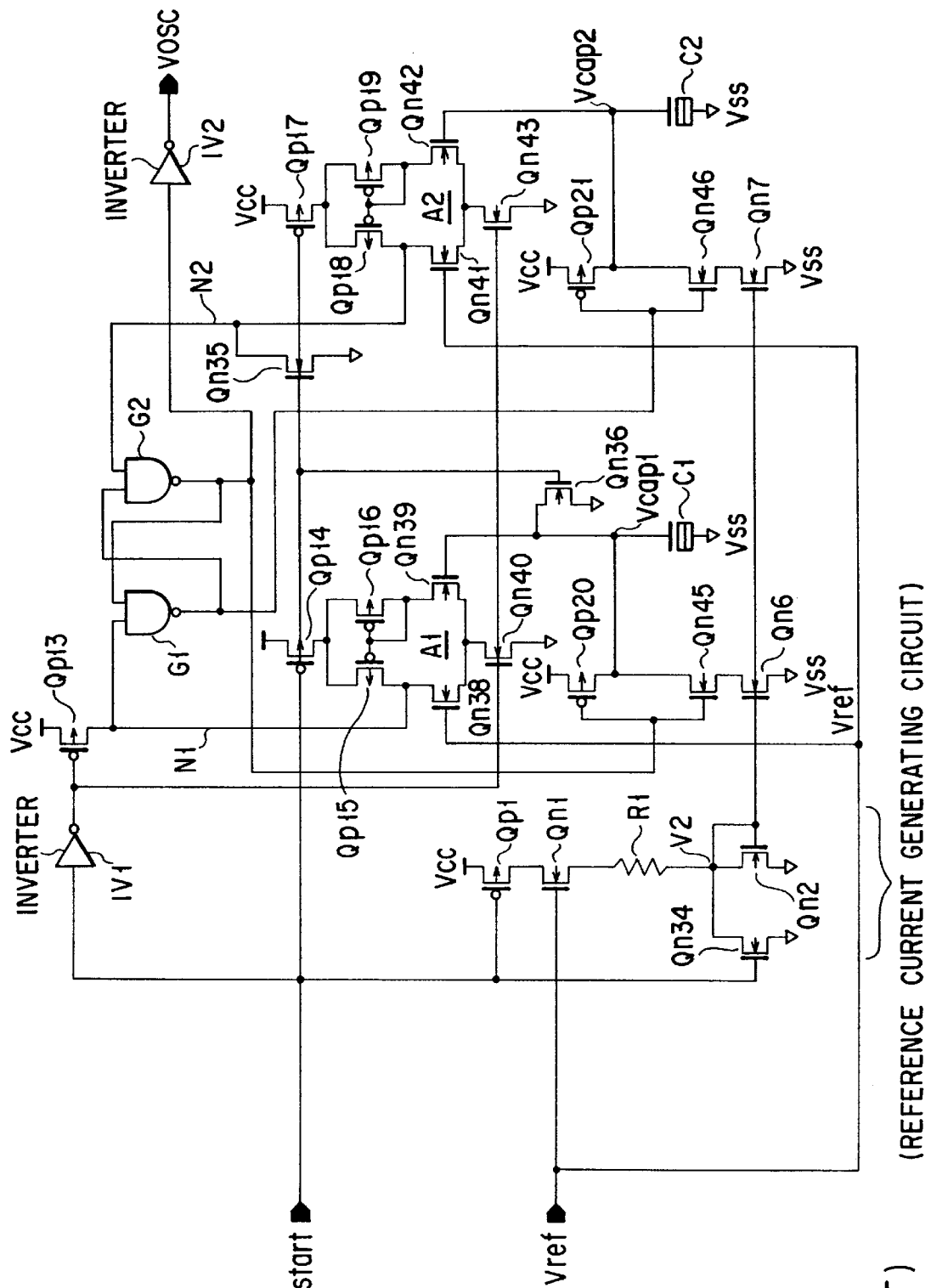
FIG. 2 is a circuit diagram showing the constitution of the conventional oscillation circuit using the reference current generating circuit shown in FIG. 1.

FIG. 3 is a circuit diagram showing the constitution of the reference current generating circuit in the semiconductor integrated circuit device according to the first embodiment of the present invention. In a circuit of the reference current generating circuit, a P-channel MOS transistor Qp1, a N-channel MOS transistor Qn1, a resistor R1, and a N-channel MOS transistor Qn2 are connected in series between a power supply voltage Vcc and a ground potential GND. The gate of the transistor Qp1 is supplied with a start signal $V_{start}$ for setting the circuit from the stand-by state to the active state. The transistor Qn2 has the gate and drain connected by a short circuit to constitute a diode, the signal $V_{out}$ as the output of the circuit to make a reference current $I_{ref}$ equal to the current flowing the resistor R1 flow into a N-channel MOS transistor Qn6 connected to Qn2 to constitute a current mirror circuit.

In addition to the reference current generating circuit 1 as mentioned above, the circuit according to the present invention includes a level shifter 2 for adding the drops of the threshold voltages of the transistors Qn1 and Qn2 to the reference voltage. The potential obtained by the level shifter 2 is applied to the gate of the transistor Qn1 of the reference current generating circuit.

In the level shifter 2, a P-channel transistor Qp2 is supplied with the signal $V_{start}$ at the gate, and supplied with the power supply voltage Vcc at the source. The drain of the transistor Qp2 is connected to the gate and the drain of a N-channel MOS transistor Qn3 via a load element R2. The gate and the drain of the N-channel MOS transistor Qn3 are connected to the gate of the transistor Qn1 of the reference current generating circuit. The source of the transistor Qn3 is connected to the gate and drain of a N-channel MOS transistor Qn4. The source of the transistor Qn4 is applied with a reference voltage $V_{ref}$ generated by the external circuit.

The transistors Qn1 and Qn2 in the reference current generating circuit 1 have a threshold voltage to that of the transistors Qn3 and Qn4 in the level shifter 2. When the threshold voltage of the transistor Qn3 and Qn4 is $V_{th}$, the voltage $V_{ref}$ applied to the gate of the transistor Qn1 is represented by the following equation (5):

$$V_{ref'}=V_{ref}+2V_{th} \qquad (5)$$

This relationship is obtained when the total resistance value of the transistor Qn3 and Qn4 is smaller than that of the load element R2.

In this time, the current value $I_{ref}$ is represented as follows:

$$I_{ref}=(V1-V2)/R1=(V_{ref'}-2V_{th})/R1 \qquad (6)$$

When the equation (5) is substituted for $V_{ref'}$ in the equation (6), $I_{ref}$ is represented by the following equation (7):

$$I_{ref}=V_{ref}/R1 \qquad (7)$$

In this manner, the term of the threshold voltage $V_{th}$ can be canceled from the expression of the reference current $I_{ref}$, and the reference current independent from the influence of the variation of the threshold voltage substantially equal $V_{th}$ can be obtained.

Figure 4:
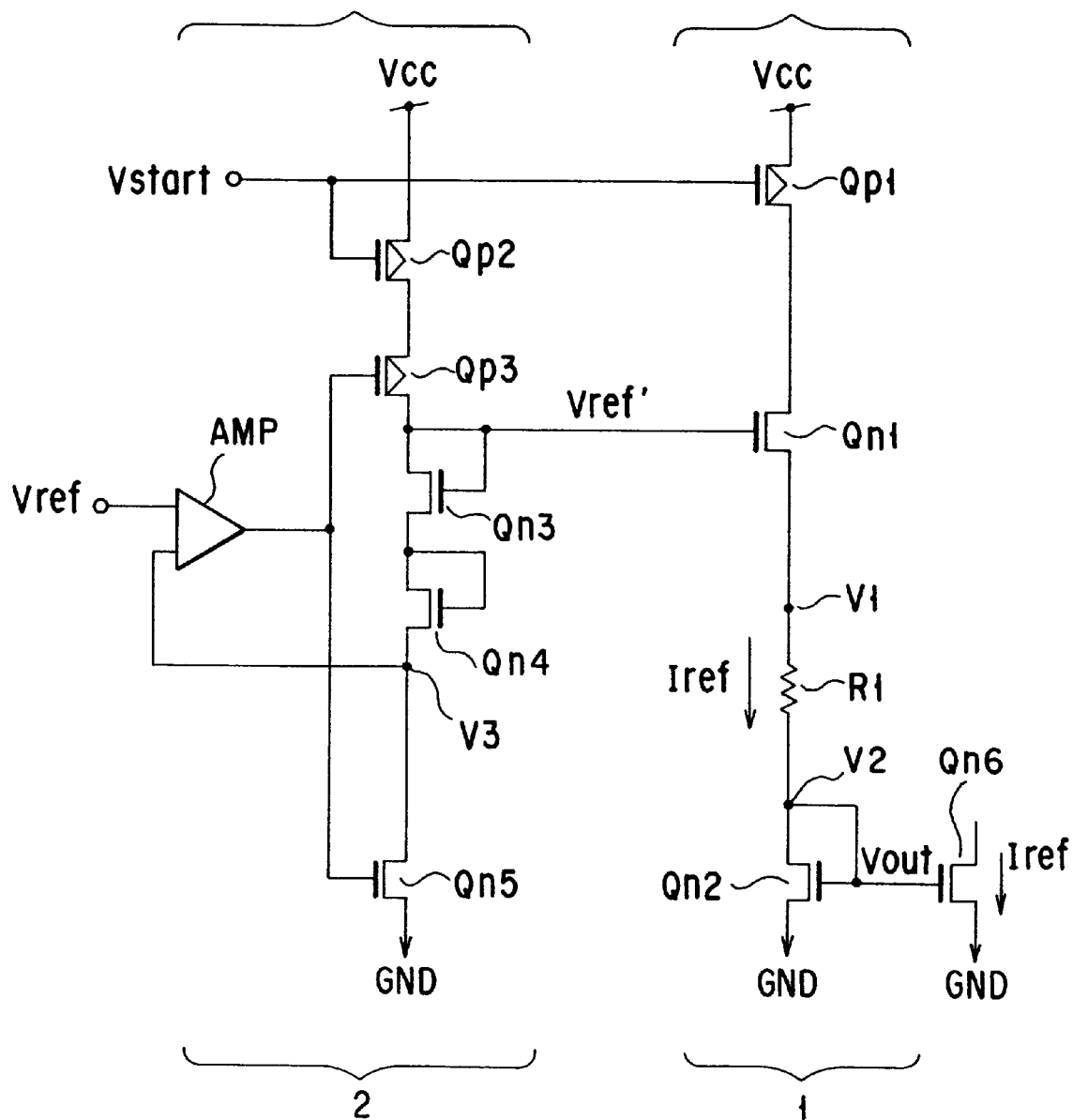
FIG. 4 is a circuit diagram showing the constitution of the reference current generating circuit according to the second or third embodiment of the present invention.

FIG. 4 is a circuit diagram showing the constitution of the reference current generating circuit according to the second embodiment of the present invention. The level shifter 2 of the circuit of this embodiment includes, in addition to the elements of the circuit shown in FIG. 3, a differential amplifier AMP for comparing the reference voltage $V_{ref}$ and the potential V3 at the source of the transistor Qn4, and a P-channel MOS transistor Qp3 and a N-channel MOS transistor Qn5 as load elements controlled by the output of the differential amplifier AMP.

The P-channel MOS transistors Qp3 has the source and the drain respectively connected to the drain of the transistor Qp2 and the drain (and the gate) of the transistor Qn3. The drain and the source of the N-channel MOS transistor Qn5 are respectively connected to the source of the transistor Qp4 and the ground node GND. The gates of the transistors Qp3 and Qn5 connected to each other are controlled by the output of the differential amplifier AMP.

According to the above constitution, the difference between the reference voltage $V_{ref}$ and the potential V3 at the source of the transistor Qn4, which is amplified and output from the differential amplifier AMP, is fed back to the transistor Qn4 by the transistor loads Qp3 and Qn5 such that the potential V3 at the source of the transistor Qn4 is substantially controlled to the reference voltage $V_{ref}$. The aforementioned relationship among $V_{ref}$, $V_{ref}$, and $V_{th}$ represented by the equation (5) can be also obtained by this constitution. Accordingly, with this constitution, the reference voltage $V_{ref}$ is increased by the threshold voltages of the transistors Qn1 and Qn2 with use of the transistors Qn3 and Qn4, and thus the variation of the threshold voltages of the transistors can be compensated to stabilize the current value $I_{ref}$, similarly to the circuit shown in FIG. 3.

The constitution of the reference current generating circuit in the semiconductor integrated circuit device according to the third embodiment of the present invention will be described next. The constitution of the circuit of the third embodiment is the same as that shown in FIG. 4. In this embodiment, the transistors Qn1 and Qn2, and Qn3 and Qn4 having the threshold voltages different from those of the E(enhancement)-type transistors used in the normal circuit are employed.

For example, when the threshold voltage of the normal E-type N-channel MOS transistor is 0.7V, the transistors Qn1–Qn4 are the I(intrinsic)-type N-channel MOS transistors having the threshold voltage of 0.4V or below, more preferably, around 0.1V.

Assuming that the threshold voltage of the I-type transistors is $V_{thI}$, the reference voltage $V_{ref}$ applied to the gate of the transistor Qn1 is represented as follows, on the basis of the equations (5) and (6) used in the first embodiment:

$$V_{ref}=V_{ref}+2V_{thI} \quad (8)$$

In this time, the current value $I_{ref}$ is represented as follows:

$$I_{ref}=(V1-V2)/R1 =(V_{ref}-2V_{thI})/R1 \quad (9)$$

When the equation (8) is substituted for $V_{ref}$ in the equation (9), $I_{ref}$ is represented by the following equation (10):

$$I_{ref}=V_{ref}/R1 \quad (10)$$

As should be clear from the above, the term of the threshold voltage is canceled from the $I_{ref}$ expression, and thus the same relationship as represented by equation (7) is obtained. Therefore, the same effect as obtained in the first and second embodiments will be obtained also in this embodiment. In addition, the I-type transistor having a low threshold voltage is used in this embodiment, and thus the variation in the threshold voltage of the transistors can be suppressed at a very low level.

In the embodiments, the transistors Qn1 and Qn2 in the reference current generating circuit 1 have a threshold voltage substantially equal to that of the transistors Qn3 and Qn4 in the level shifter 2. It is particularly important for the present invention that the total sum of the threshold voltages of the transistors Qn1 and Qn3 is substantially equal to that of the threshold voltages of the transistors Qn2 and Qn4. The present invention is thus effectively performed also in the case where the transistors Qn1 and Qn2 have threshold voltage $V_{ref1}$ and the transistors Qn3 and Qn4 have threshold voltage $V_{ref2}$. Also in the other case, the threshold voltages may be set such that the transistors Qn1 and Qn4 have the threshold voltage of $V_{ref1}$ and the transistors Qn2 and Qn3 have the threshold voltage of $V_{ref2}$.

In this manner, according to the embodiments, the reference current generating circuit capable of supplying the current independent from the influence of the power supply voltage and free from the influence of the variation of the threshold voltages of the transistors due to some causes in the manufacturing process can be constituted. Such a constitution is useful in incorporating it into the semiconductor integrated circuit device including the oscillation circuit using a reference current, for example, a non-volatile semiconductor memory device as disclosed in U.S. Pat. No. 5,627,488.

Figure 9:
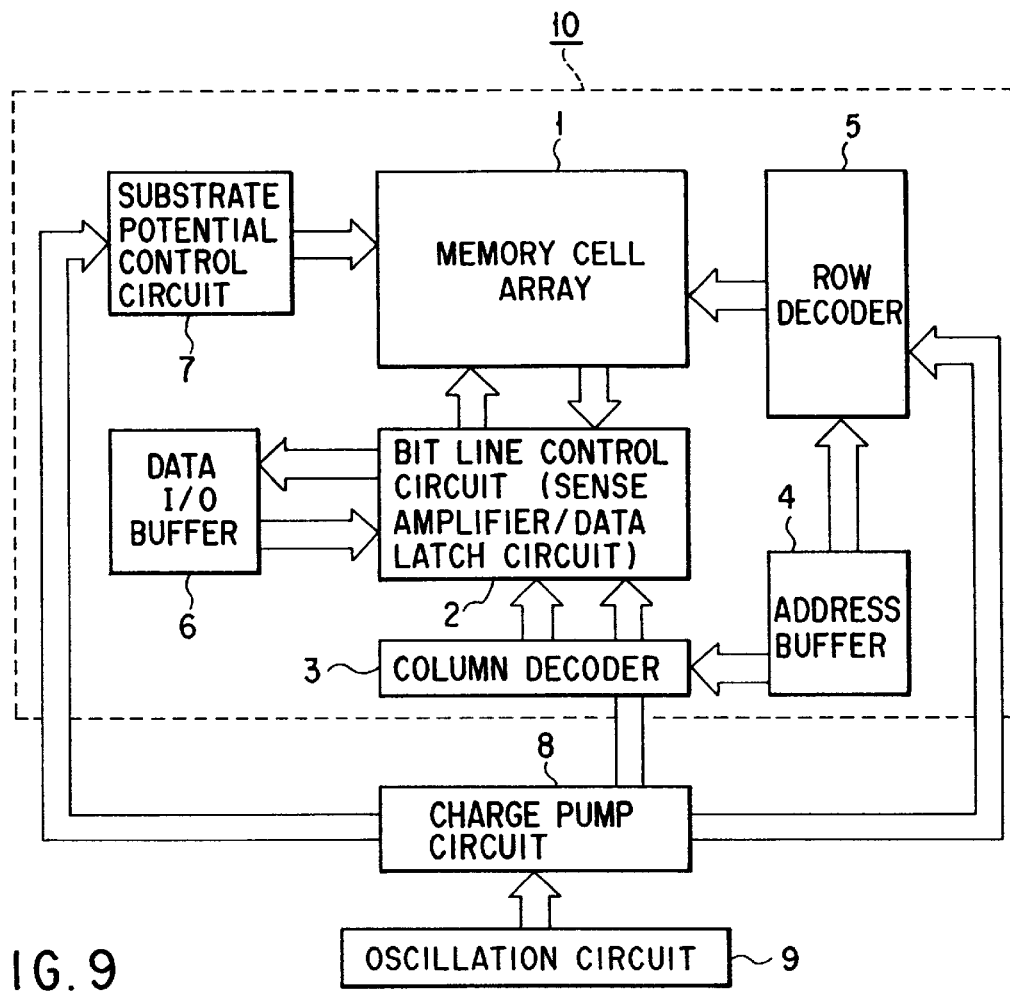
FIG. 9 is a block diagram of a non-volatile semiconductor memory device using EEPROMS.

FIG. 9 is a block diagram of the non-volatile semiconductor memory device.

In the non-volatile semiconductor memory device, a bit line control circuit 2 is provided to write/read data in/from a memory cell array 1 in which a plurality of non-volatile memory cells are arranged. The bit line control circuit 2 is connected to a data I/O buffer 6 so as to receive the output from a column decoder 3 receiving an address signal output from an address buffer 4. In order to control a control gate and a selection gate of each memory cell in the memory cell array 1, the memory device is provided with a row decoder 5 and with a substrate potential control circuit 7 for controlling the potential of the substrate (p-type well or the like) on which the memory cell array 1 is formed.

A memory device body 10 is constituted from the above-mentioned function blocks such as the memory cell array 1 and the substrate potential control circuit 7. Upon receiving a driving signal output from an oscillation circuit 9, a charge pump circuit 8 boosts a voltage applied by the power supply voltage and applies the boosted voltage to the bit line control circuit 2, the row decoder 5, and the substrate potential control circuit 7 in writing/erasing data in/from the memory cell array 1.

The present invention has an effect when it is used as the oscillation circuit 9 for generating a driving signal for driving the charge pump circuit 8 in the above memory device. The following is the description of the oscillation circuit as an application of the present invention.

Figure 5:
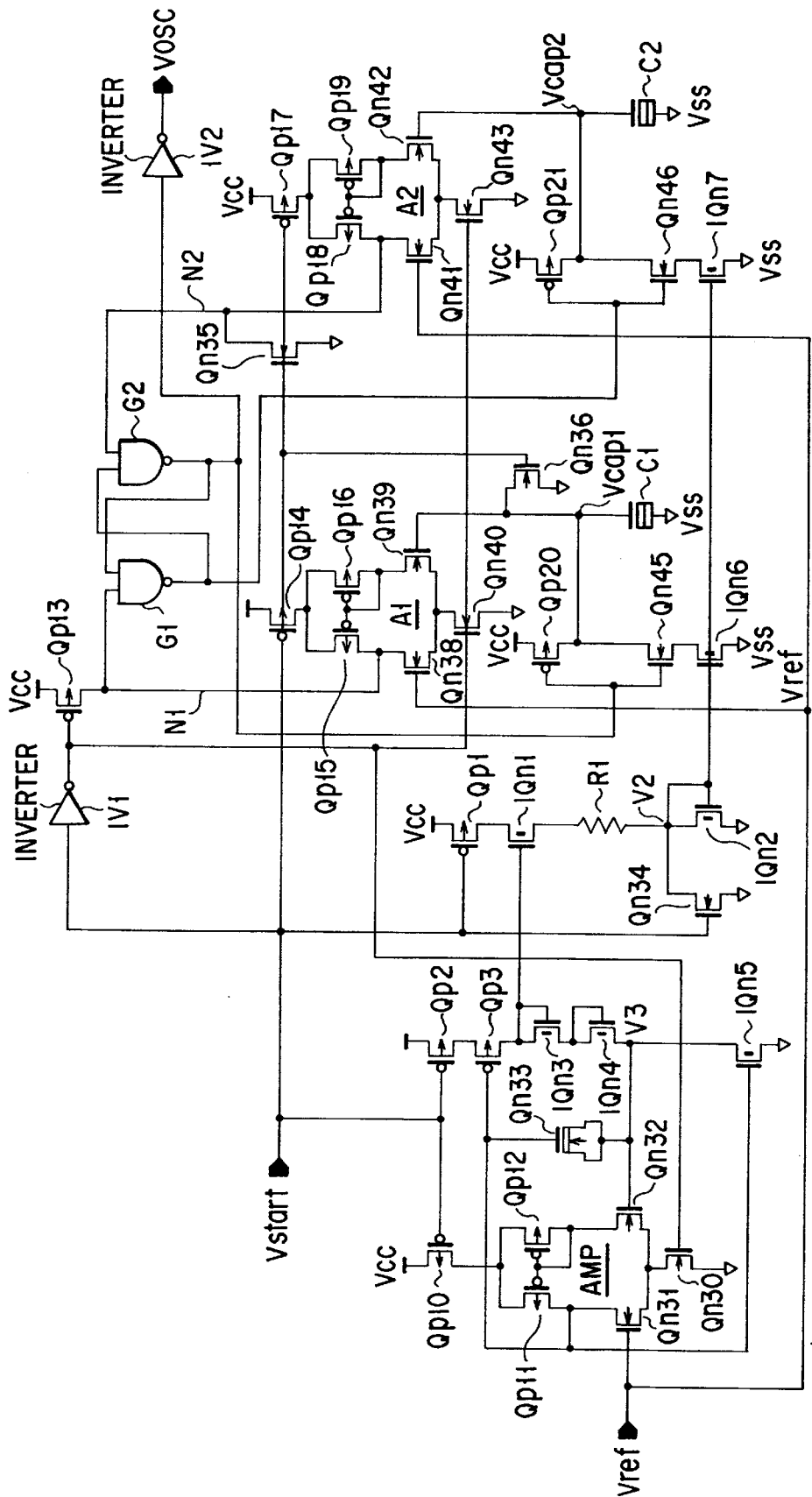
FIG. 5 is a circuit diagram showing the constitution of the oscillation circuit according to the fourth embodiment of the present invention, in which the constitution shown in FIG. 4 is used as a reference current source.

FIG. 5 is a circuit diagram showing the constitution of the oscillation circuit according to the fourth embodiment of the present invention, in which the constitution shown in FIG. 4 is used as a reference current source. The elements shown in FIG. 4 are denoted by the same reference numerals. In the fourth embodiment, the N-channel transistors Qn1–Qn6 in FIG. 4 are the I-type transistors as described in the third embodiment, and denoted as IQn1–IQn6 (IQn7 in the oscillation circuit is also the I-type transistor). Further, the portion denoted as "AMP" in the level shifter 2 is a differential amplifier constituted of transistors Qn30–Qn32 and Qp10–Qp12. A transistor Qn33 is used as a capacitor for preventing this feed-back control system from oscillating.

One end of a capacitor (the first capacitor element) C1 in the oscillation circuit is selectively connected to either of a power supply voltage Vcc and a drain of a N-channel MOS transistor (a first reference current source) IQn6 in accordance with the voltage level of the common gate of a N-channel MOS transistor Qn45 and a P-channel MOS transistor Qp20. Similarly, one end of a capacitor (the second capacitor element) C2 is selectively connected to either of a power supply voltage Vcc and a drain of the N-channel MOS transistor (a second reference current source) IQn7 in accordance with the voltage level of the common gate of a N-channel MOS transistor Qn46 and a P-channel MOS transistor Qp21.

P-channel MOS transistors Qp14–Qp16 and N-channel MOS transistors Qn38–Qn40 constitute a first amplifier A1 for comparing the reference voltage $V_{ref}$ with the voltage $V_{cap1}$ at the one end of the capacitor C1 and amplifying the difference thereof to output the amplified difference. Similarly, P-channel MOS transistors Qp17–Qp19 and N-channel MOS transistors Qn41–Qn43 constitute a second amplifier A2 for comparing the reference voltage $V_{ref}$ with the voltage $V_{cap2}$ at the one end of the capacitor C2 and amplifying the difference thereof to output the amplified difference.

NAND gates G1 and G2 constitute an order logic circuit for outputting the order logic of these two amplifiers. In accordance with the output of the order logic circuit, the voltage level of the common gate of the transistors Qp45 and Qp20 and that of the common gate of the transistors Qp46 and Qp21 are alternately set at "H" (High level) and "L" (Low level).

Figure 8:
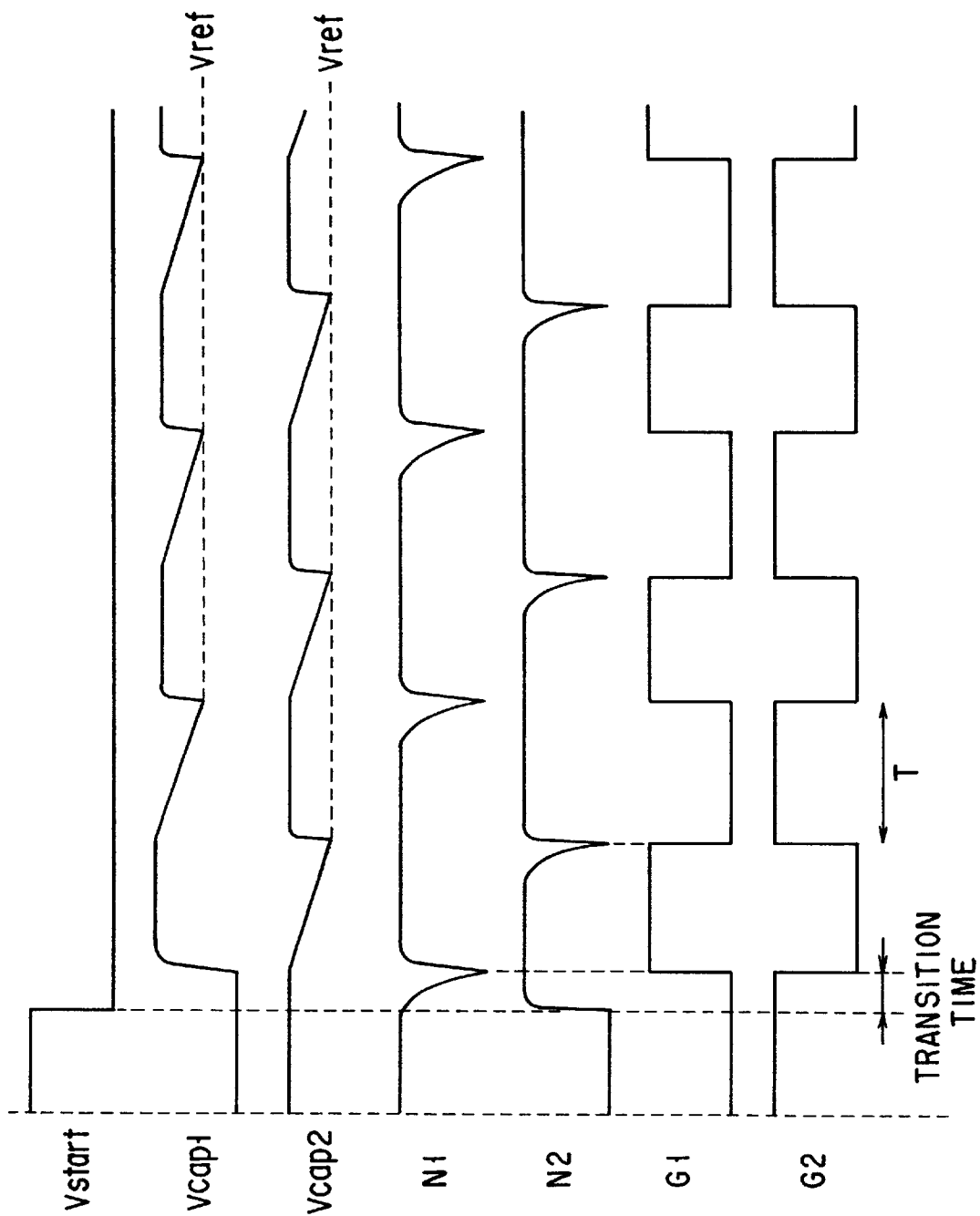
FIG. 8 is a timing chart for showing the operation of the oscillation circuit of FIG. 5, 6 or 7, in which the output timings of the signals are drawn.

FIG. 8 is a timing chart for showing the oscillation of the circuit as described above, in which the timings of the signals are drawn. With reference to this timing chart, the operation of the circuit shown in FIG. 5 will be described below.

At the stand-by time, the signal $V_{start}$ is set at "H". By setting the level of the signal $V_{start}$ at "H" in this manner, the P-channel MOS transistors Qp1, Qp2, Qp10, Qp14, and Qp17 and the N-channel MOS transistors Qn30, Qn40, and Qn43 are left to be turned off to cut off the power supply system from the circuit. While, the P-channel MOS transistor Qp13 and the N-channel MOS transistors Qn34, Qn35, and Qn36 are in an ON state in this time, thereby this circuit is initialized: that is, the output of the NAND gate G2 is set at "H", and the output of the NAND gate G1 is set at "L", and thus the voltage $V_{cap1}$ of the capacitor C1 is set at "L", and the voltage $V_{cap2}$ of the capacitor C2 is set at "H", and the output of the oscillation circuit VOSC is set at "L".

When the level of the signal $V_{start}$ is turned from "H" to "L", the oscillation begins: in this time, the P-channel MOS transistor Qp13 and the N-channel MOS transistors Qn34, Qn35, and Qn36 are turned off, and the P-channel MOS transistors Qp1, Qp2, Qp10, Qp14, and Qp17 and the N-channel MOS transistors Qn30, Qn40, and Qn43 are turned on. In response thereto, the reference current generating circuit according to the present invention and the differential amplifiers A1 and A2 in the oscillation circuit are set at an active state. The differential amplifier A1 operates to set the voltage $V_{cap1}$ of the capacitor C1 at "L" with respect to the reference voltage $V_{ref}$ at first, and to decrease the voltage level of the node N1 to invert the output of the NAND gate G1 to "H". The other differential amplifier A2, since the voltage $V_{cap2}$ of the capacitor C2 is set at "H" with respect to the reference voltage $V_{ref}$, operates to increase the voltage level of the node N2 to invert the output of the NAND gate G2 to "L" (in this time, the voltage level of the output signal VOSC of the oscillation circuit is turned from "L" to "H").

Upon receiving the signal of "H" from the NAND gate G1, the transistor Qn46 is turned on, thereby the capacitor C2 discharges the current $I_{ref}$ equal to the current flowing through the resistor element in the reference current generating circuit. The voltage $V_{cap2}$ of the capacitor C2 is dropped to be lower than the reference voltage $V_{ref}$ by this discharge. The voltage level of the node N2 is decreased thereby to invert the output of the NAND gate G2 to "H" (in this time, the voltage level of the output signal VOSC of the oscillation circuit is turned from "H" to "L"). While, when the NAND gate G2 outputs the signal of "L", the transistor Qp20 is turned on to charge the capacitor C1. The voltage $V_{cap1}$ of the capacitor C1 is increased thereby and the voltage level of the node N1 is increased. In this manner, during the period from the time when $V_{cap2}$ is set at Vcc to the time when $V_{cap2}$ is decreased to $V_{ref}$, the NAND gate G1 is stabilized at the level of "H", and G2 is stabilized at the level of "L".

On the other hand, upon receiving the signal of "H" from the NAND gate G2, the transistor Qn45 is turned on. The capacitor C1 thereby discharges the current $I_{ref}$ equal to the current flowing through the resistor element in the reference current generating circuit. The voltage $V_{cap1}$ of the capacitor C1 is dropped to invert the output of the NAND gate G1 to "H" (in this time, the voltage level of the output signal VOSC of the oscillation circuit is turned to "H"). While, when the NAND gate G1 outputs the signal of "L", the transistor Qp21 is turned on to charge the capacitor C2. The voltage $V_{cap2}$ of the capacitor C2 is increased thereby and the voltage level of the node N2 is increased. In this manner, during the period from the time when $V_{cap1}$ is set at Vcc to the time when $V_{cap1}$ is decreased to $V_{ref}$, the NAND gate G1 is stabilized at the level of "L", and G2 is stabilized at the level of "H". By alternately repeating these two states, the oscillation circuit oscillates.

In this integrated circuit, the transistor IQn6 as the first reference current source, the differential amplifier A1, and the capacitor C1 controlled by the operation of the differential amplifier A1 to charge/discharge a current constitute a first delay circuit. The transistor IQn7 as the second reference current source (this second reference current source generates a reference current substantially equal to that generated by the first and current source), the differential amplifier A2, and the capacitor C2 controlled by the operation of the differential amplifier A2 to charge/discharge a current constitute a second delay circuit. The outputs of the first and second delay circuits are input into the order logic circuit comprising the NAND gate G1 and G2, respectively, and the outputs of the order logic circuit are input into the first and second delay circuits, respectively. The output of the amplifiers A1 and A2 are inverted thereby, and the output of the order logic circuit is inverted to output the oscillation output signal VOSC.

In the above-mentioned constitution, assuming that the capacitances of the capacitors C1 and C2 are C, a half period of the oscillation is T, the discharge of the capacitors C1 and C2 by the current $I_{ref}$ generated by the reference current generating circuit through a current mirror circuit is represented by the following equation (11):

$$C(Vcc-V_{ref})/T=I_{ref} \qquad (11)$$

When the equation (10) "$I_{ref}=V_{ref}/R1$" is substituted for $I_{ref}$, the following equation is obtained:

$$T=C \cdot R1 \cdot \{(Vcc/V_{ref})-1\} \qquad (12)$$

As should be clear from the equation (12), the oscillation half period T depends on the power supply voltage Vcc, and will be increased as the power supply voltage Vcc is increased. In the normal semiconductor circuit, when the power supply voltage is increased, the operation speed is also increased, and the operation period is decreased thereby. Therefore, the oscillation circuit of the present invention has the dependence on the power supply voltage which is opposite to that of the normal circuit.

In order to obtain the primary term in the equation (12), the present invention constitutes the reference current generating circuit to be independent from the influence of the power supply voltage by using the reference voltage $V_{ref}$. This is because, if the reference current generating circuit depends on the power supply voltage, the power supply voltage Vcc is placed instead of the term of the reference voltage $V_{ref}$ in the equation (12), thereby the term Vcc is canceled from the equation (12), resulting that the oscillation period does not depend on the power supply voltage.

In general, the boosting ability of the charge pump circuit is increased as the frequency of the input pulse is increased, or as the power supply voltage is increased. Accordingly, by using the oscillation circuit to generate a charge pump circuit driving signal the frequency of which is increased as the power supply voltage is decreased, i.e., by using the oscillation circuit having the opposite dependence on the power supply voltage (the characteristics that the oscillation period is increased as the power supply voltage is increased), the dependence of the boosting ability on the power supply voltage can be remarkably reduced.

Further, in the oscillation circuit having the above-mentioned constitution, the reference voltage $V_{ref}$ set at so high level ($V_{ref}$ is, however, set to satisfy the relationship $Vcc>V_{ref}$) is used for comparison by the differential amplifier. As the reference voltage $V_{ref}$ is increased, the dependence of the variation of the oscillation period on the power supply voltage Vcc is increased (an oscillation half period corresponds to the period during which the capacitor discharges a current to decrease $V_{cap}$ from Vcc to $V_{ref}$ upon receiving the reference current $I_{ref}$, and thus the dependence of the variation on the power supply voltage Vcc becomes remarkably large when the reference voltage $V_{ref}$ is increased).

As described above, the dependence of the oscillation period on the power supply voltage can be increased by increasing the level of the reference voltage $V_{ref}$. The differential amplifier, however, cannot amplify the signal when the input voltage level of the amplifier is increased so close to the level of the power supply voltage, and thus the level of the reference voltage $V_{ref}$ must be increased so carefully.

The differential amplifier circuits A1 and A2 can amplify the signal merely to the level of the input voltage lower than the power supply voltage. For example, assuming that the power supply voltage Vcc is temporarily dropped due to the influence of the operation of the other peripheral circuits (the operation of the cell, for example) when the power supply voltage is set at low in the constitution shown in FIG. 5. If the power supply voltage Vcc and the reference voltage $V_{ref}$ are set in this time at a substantially equal level due to the overshooting of the reference voltage $V_{ref}$ as it occurred immediately after the starting operation, the differential amplifier cannot operate any more and the oscillation circuit is set at the stop point at which the oscillation circuit makes no oscillation. If the oscillation circuit is set at the stop point, the oscillation circuit does not operate unless the start signal $V_{start}$ is output again. In order to prevent such a matter, the level of the reference voltage $V_{ref}$ must be set carefully.

FIG. 6 is a circuit diagram showing the constitution of the oscillation circuit as one modification of the semiconductor integrated circuit device shown in FIG. 5, in which the constitution shown in FIG. 4 is used as a reference current source. Unlike the device shown in FIG. 5, the output point of the reference voltage $V_{ref}$ is placed at a feedback node (V3) of the differential amplifier AMP.

According to the above constitution, the reference voltage V3 is lower than the power supply voltage Vcc at least by the threshold voltages of the transistors IQn3 and IQn4, and thus the operation of the oscillation circuit is more stabilized thereby. With this constitution, the oscillation circuit is prevented from reaching the stop point at which the oscillation circuit does not oscillate even if the overshooting of the reference voltage occurs immediately after the starting when the power supply voltage Vcc is temporarily dropped due to the influence of the operation of the other peripheral circuits in a condition where the low power supply voltage is set at a low level. In this manner, the stabilized operation of the oscillation circuit is ensured, resulting in the improvement of the reliability of the circuit.

Figure 7:
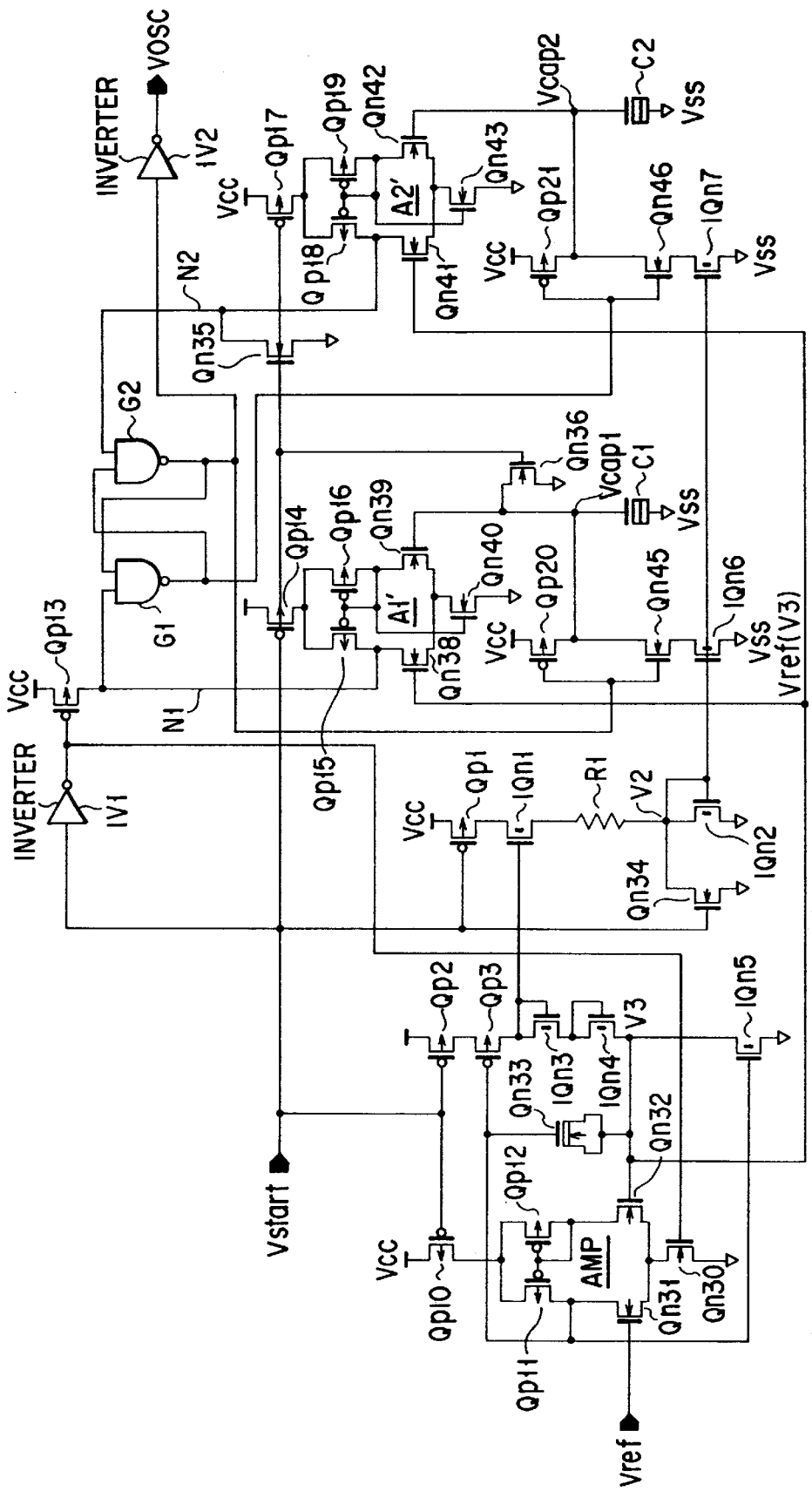
FIG. 7 is a circuit diagram showing the constitution of the oscillation circuit as a modification of the semiconductor integrated circuit device shown in FIG. 6, in which the constitution shown in FIG. 4 is used as a reference current source.

FIG. 7 is a circuit diagram showing the constitution of the oscillation circuit as a modification of the semiconductor integrated circuit device shown in FIG. 6, in which the constitution shown in FIG. 4 is used as a reference current source. This circuit is discriminated from the circuit shown in FIG. 6 by the differential amplifiers A1' and A2'. The differential amplifiers A1 and A2 shown in FIGS. 5 and 6 are constituted such that the gates are controlled by the start signal $V_{start}$. While, the differential amplifiers A1' and A2' shown in FIG. 7 are constituted such that the gates of the transistors Qn40 and Qn43 are respectively controlled by the outputs of current mirror circuits in the amplifiers. By controlling the gates in this manner, the amplifiers are made so dependent on the differential output, and the sensitivity of the amplifiers is improved.

The constitution of the difference amplifiers will be described below with respect to the constitution of A1'. The gates of N-channel MOS transistors Qn38 and Qn39 are respectively supplied with an input signal: the gate of the N-channel MOS transistor Qn38 is applied with the reference voltage, and the gate of N-channel MOS transistor Qn39 is applied with the voltage $V_{cap1}$ at the one end of the capacitor C1. The drains of the P-channel MOS transistors Qp15 and Qp16 are connected to the N-channel MOS transistors Qn38 and Qn39, respectively. One of the drains of the P-channel MOS transistors Qp15 and Qp16 is connected to a common gate thereof, thereby a current mirror current is supplied to the transistors Qn38 and Qn39. The sources of the P-channel MOS transistors Qp15 and Qp16 are connected to a drain of the P-channel MOS transistor Qp14. The P-channel MOS transistor Qp14 is controlled by the signal input into the gate thereof to supply the power supply voltage applied to its own source to the P-channel MOS transistors Qp15 and Qp16. The sources of the transistors Qn38 and Qn39 are connected to the drain of the N-channel MOS transistor Qn40. The transistor Qn40 is applied with the ground potential at the source thereof and the gate thereof is connected to the drain of the transistor Qn39 such that the transistor is controlled to be switched by the differential output of the amplifier.

The three oscillation circuits have been described above. Each of them incorporates therein the reference current generating circuit according to the present invention which outputs a reference current controlled by using the difference between the reference voltage and the voltage at the end of a capacitor charged/discharged by the reference current, thereby has the opposite dependence on the power supply voltage, i.e., the characteristics which the frequency of the oscillation by the oscillation circuit is decreased as the power supply voltage is increased in reverse ratio to the power supply voltage. By combining such an oscillation circuit with a charge pump circuit, the dependence of the boosting ability on the power supply voltage can be remarkably reduced.

Figure 10:
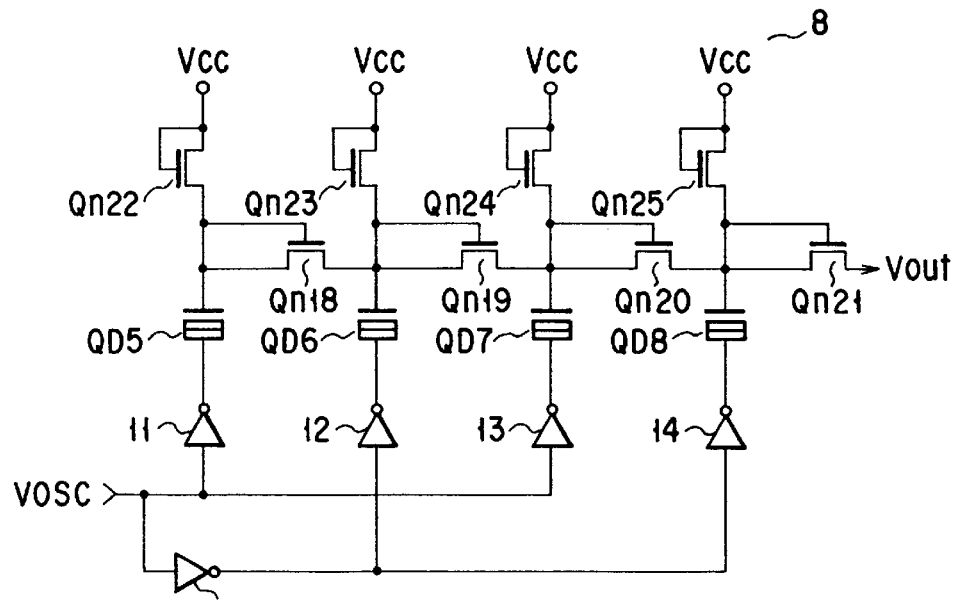
FIG. 10 is a circuit diagram showing an example of the constitution of a charge pump circuit included in the circuit shown in FIG. 9.

FIG. 10 shows one constitution of the charge pump circuit 8 of FIG. 9. The output VOSC of the oscillation circuit shown in any of FIGS. 5, 6, and 7 is used as a driving signal for driving the charge pump circuit. The boosting is performed by using depletion type N-channel MOS transistors QD5–QD8 as capacitors and (normal enhancement type or I-type) N-channel MOS transistors Qn18–Qn21 as transfer gates. Reference numerals 11–15 denote inverters.

When the driving signal VOSC is turned from "H" to "L", the transistors Qn18 and Qn20 are turned on and the transistors Qn19 and Qn21 are turned off, and the charges stored in capacitors QD5 and QD7 are transferred to capacitors QD6 and QD8.

On the other hand, when the driving signal VOSC is turned from "L" to "H", the transistors Qn18 and Qn20, and the transistors Qn19 and Qn21 as transfer gates are oppositely turned on/off, respectively. The charges stored in the capacitors QD6 and QD8 are transferred to the capacitor QD7 and the output terminal $V_{out}$ of the charge pump circuit. The turning on/off operations as described above are alternately repeated to boost the power supply voltage. In general, the boosting ability of the charge pump circuit 8 decreases as the power supply voltage decreases. The decrease of the boosting ability can be compensated by increasing the frequency of the charge pump circuit driving signal VOSC output from the oscillation circuit.

In recent years, the power supply voltage is designed to be decreased, and thus the ratio of the threshold voltage to the power supply voltage has been increased over the years. The reference current generating circuit of the present invention is constituted to generate a reference current so as to cancel the term of the threshold voltage therefrom, and thus can be applied to the circuit having a low power supply voltage.

As described above, according to the present invention, the level shifter is connected to the reference current generating circuit. With use of the diode-connected transistors in the level shifter, the reference voltage of the reference current generating circuit can be increased, and the variation of the reference current due to the variation of the threshold voltages of the transistors in the reference current generating circuit can be compensated thereby. By virtue of these two features, the present invention can be usefully applied to the semiconductor integrated circuit which needs the reference current generating circuit independent from the influence of the variation of the threshold voltages of the transistors in the reference current generating circuit.

Further, according to the present invention, the circuit can be designed to generate the driving signal for driving of the charge pump circuit for boosting the power supply voltage by using the reference voltage generating circuit free from the variation of the threshold voltage in the oscillation circuit for generating the driving signal, and the reference voltage capable of preventing the oscillation circuit from stopping the oscillation when the power supply voltage and the reference voltage are set at a substantially equal level can be applied to an amplifier. Consequently, the present invention can provide the semiconductor integrated circuit device useful for the device such as the non-volatile memory device, which uses a charge pump circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device, comprising:
a reference current generating circuit including
a first MOS transistor having a gate connected to a first node having a first potential,
a second MOS transistor having a gate and a drain connected to each other so as to constitute a diode, the gate and the drain being connected to a second node having a second potential, and
a resistor connected between a source of the first MOS transistor and the second node; and
a level shifter including
a third MOS transistor applied with the first potential from a power supply through a load element, the third MOS transistor having a drain and a gate connected to each other so as to constitute a diode, the drain and the gate being connected to the first node having the first potential, and
a fourth MOS transistor constituted as a diode by connecting a gate and a drain thereof to the source of the third MOS transistor and having a source applied with a reference voltage,
wherein the third and the fourth MOS transistors of the level shifter comprise transistors a total sum of threshold voltages of which is substantially equal to a total sum of threshold voltages of the first and second MOS transistors of the reference current generating circuit, and generate a reference current in the resistor of the reference current generating circuit in accordance with a voltage applied to the gate of the first MOS transistor,
a memory body having a function as a non-volatile memory;
a charge pump circuit for generating a voltage necessary to write/erase data in/from the memory body, boosting ability thereof depending on a frequency of a driving signal for driving the charge pump circuit; and
an oscillation circuit for generating the driving signal for driving the charge pump circuit in which an oscillation frequency thereof is varied in accordance with a power supply voltage, including
a delay circuit having
a reference current source for generating a current having a substantially constant current value,
a capacitor connected at one end to the reference current source when an input signal is inverted, and
an amplifier for amplifying a difference between a reference voltage and a voltage at the one end of the capacitor until the inversion of the input signal and outputting the difference, the difference increasing as the power supply voltage increases,
wherein the reference current of the reference current source is generated by using a combination of the reference current generating circuit and the level shifter.

2. A semiconductor integrated circuit device according to claim 1, wherein the oscillation circuit includes
- a first delay circuit having
  - a first reference current source for generating a current having a substantially constant current value,
  - a first capacitor connected at one end to the first reference current source when an input signal is inverted, and
  - a first amplifier for amplifying a difference between the reference voltage and a voltage at the one end of the first capacitor until the inversion of the input signal and outputting the difference, the difference increasing as the power supply voltage increases;
- a second delay circuit having
  - a second reference current source for generating a current having a substantially constant current value,
  - a second capacitor connected at one end to the second reference current source when an input signal is inverted, and
  - a second amplifier for amplifying a difference between the reference voltage and a voltage at the one end of the second capacitor and outputting the difference; and
- an order logic circuit for outputting an order logic of output of the first and second amplifiers and inputting the logic to the first and second delay circuits, and
- the reference currents of the first and second reference current sources are generated by using a combination of the reference current generating circuit and the level shifter.

3. A semiconductor integrated circuit device according to claim 1, wherein the reference voltage is set to be lower than the power supply voltage.

4. A semiconductor integrated circuit device according to claim 1, wherein the amplifier includes
- first and second N channel-type MOS transistors each gate of which functions as an input terminal,
- first and second P channel-type MOS transistors drains of which are respectively connected to corresponding one of drains of the first and second N channel-type MOS transistors, one of the drains being connected to a common gate of the first and second P channel-type MOS transistors to supply a current-mirror current to the first and second N channel-type MOS transistors,
- a third P channel-type MOS transistor a drain of which is connected to sources of the first and second P channel-type MOS transistors, the third P channel-type MOS transistor applying the power supply voltage applied to a source thereof to the first and second P channel-type MOS transistors in accordance with a signal input into a gate thereof, and
- a third N channel-type MOS transistor having a drain connected to sources of the first and second N channel-type MOS transistors, a source applied with a ground potential, and a gate to which an inverted signal of the signal input into the gate of the third P channel-type MOS transistor is input to switch the third N channel-type MOS transistor.

5. A semiconductor integrated circuit device according to claim 1, wherein the amplifier includes
- first and second N channel-type MOS transistors each gate of which functions as an input terminal,
- first and second P channel-type MOS transistors drain of which are respectively connected to corresponding one of drains of the first and second N channel-type MOS transistors, one of the drains being connected to a common gate of the first and second P-channel type MOS transistors to supply a current mirror current to the first and second N channel-type MOS transistors,
- a third P channel-type MOS transistor a drain of which is connected to sources of the first and second P channel-type MOS transistors, the third P channel-type MOS transistor applying the power supply voltage applied to a source thereof to the first and second P channel-type MOS transistors in accordance with a signal input into a gate thereof, and
- a third N channel-type MOS transistor having a drain connected to sources of the first and second N channel-type MOS transistors, a source applied with a ground potential, and a gate connected to the common gate of the first and second P channel-type MOS transistors to switch the third N channel-type MOS transistor by a differential output of the amplifier.

6. A semiconductor integrated circuit device, comprising:
- a reference current generating circuit including
  - a first MOS transistor having a gate connected to a first node having a first potential,
  - a second MOS transistor having a gate and a drain connected to each other so as to constitute a diode, the gate and the drain being connected to a second node having a second potential, and
  - a resistor connected between a source of the first MOS transistor and the second node; and
- a level shifter including
  - a third MOS transistor applied with the first potential from a power supply through a P-channel MOS transistor load element, the third MOS transistor having a drain and a gate connected to each other so as to constitute a diode, the drain and the gate being connected to the first node having the first potential,
  - a fourth MOS transistor constituted as a diode by connecting a gate and a drain thereof to the source of the third MOS transistor and a source to a drain of an N-channel MOS transistor load element, and
  - a differential amplifier for controlling the P-channel MOS transistor load element and the N-channel MOS transistor load element by outputting a difference between a reference voltage and a potential at the source of the fourth MOS transistor,
- wherein the third and the fourth MOS transistors of the level shifter comprise transistors a total sum of threshold voltages of which is substantially equal to a total sum of threshold voltages of the first and the second MOS transistors of the reference current generating circuit, and generate a reference current in the resistor of the reference current generating circuit in accordance with a voltage applied to the gate of the first MOS transistor,
- a memory body having a function as a non-volatile memory;
- a charge pump circuit for generating a voltage necessary to write/erase data in/from the memory body, boosting ability thereof depending on a frequency of a driving signal for driving the charge pump circuit; and
- an oscillation circuit for generating the driving signal for driving the charge pump circuit in which an oscillation frequency thereof is varied in accordance with a power supply voltage, including
  - a delay circuit having
    - a reference current source for generating a current having a substantially constant current value, a capacitor connected at one end to the reference current source when an input signal is inverted, and an amplifier for amplifying a difference between a reference voltage and a voltage at the one end of the capacitor until the inversion of the input signal and the outputting the difference, the difference increasing as the power supply voltage increases, wherein the reference current of the reference current source is generated by using a combination of the reference current generating circuit and the level shifter.

7. A semiconductor integrated circuit device according to claim 6, wherein the oscillation circuit includes a first delay circuit having
a first reference current source for generating a current having a substantially constant current value,
a first capacitor connected at one end to the first reference current source when an input signal is inverted, and
a first amplifier for amplifying a difference between the reference voltage and a voltage at the one end of the first capacitor until the inversion of the input signal and outputting the difference, the difference increasing as the power supply voltage increases;

a second delay circuit having
a second reference current source for generating a current having a substantially constant current value,
a second capacitor connected at one end to the second reference current source when an input signal is inverted, and
a second amplifier for amplifying a difference between the reference voltage and a voltage at the one end of the second capacitor and outputting the difference; and an order logic circuit for outputting an order logic of output of the first and second amplifiers and inputting the logic to the first and second delay circuits, and the reference currents of the first and second reference current sources are generated by using a combination of the reference current generating circuit and the level shifter.

8. A semiconductor integrated circuit device according to claim 6, wherein the reference voltage is set to be lower than the power supply voltage.

9. A semiconductor integrated circuit device according to claim 6, wherein a source potential of the fourth MOS transistor in the level shifter is supplied as the reference voltage.

10. A semiconductor integrated circuit device according to claim 6, wherein the amplifier includes first and second N channel-type MOS transistors each gate of which functions as an input terminal, first and second P channel-type MOS transistors drains of which are respectively connected to corresponding one of drains of the first and second N channel-type MOS transistors, one of the drains being connected to a common gate of the first and second P-channel type MOS transistors to supply a current-mirror current to the first and second N channel-type MOS transistors, a third P channel-type MOS transistor a drain of which is connected to sources of the first and second P channel-type MOS transistors, the third P channel-type MOS transistor applying the power supply voltage applied to a source thereof to the first and second P channel-type MOS transistors in accordance with a signal input into a gate thereof, and a third N channel-type MOS transistor having a drain connected to sources of the first and second N channel-type MOS transistors, a source applied with a ground potential, and a gate to which an inverted signal of the signal input into the gate of the third P channel-type MOS transistor is input to switch the third N channel-type MOS transistor.

11. A semiconductor integrated circuit device according to claim 6, wherein the amplifier includes first and second N channel-type MOS transistors each gate of which functions as an input terminal, first and second P channel-type MOS transistors drains of which are respectively connected to corresponding one of drains of the first and second N channel-type MOS transistors, one of the drains being connected to a common gate of the first and second P-channel type MOS transistors to supply a current-mirror current to the first and second N channel-type MOS transistors, a third P channel-type MOS transistor a drain of which is connected to sources of the first and second P channel-type MOS transistors, the third P channel-type MOS transistor applying the power supply voltage applied to a source thereof to the first and second P channel-type MOS transistors in accordance with a signal input into a gate thereof, and a third N channel-type MOS transistor having a drain connected to sources of the first and second N channel-type MOS transistors, a source applied with a ground potential, and a gate connected to the common gate of the first and second P channel-type MOS transistors to switch the third N channel-type MOS transistor by a differential output of the amplifier.

12. A semiconductor integrated circuit device comprising:

a memory body having a function as a non-volatile memory;

a charge pump circuit for generating a voltage necessary to write/erase data in/from the memory body, boosting ability thereof depending on a frequency of a driving signal for driving the charge pump circuit; and an oscillation circuit for generating the driving signal for driving the charge pump circuit in which oscillation frequency thereof is varied in accordance with a power supply voltage, including a first delay circuit having
a first reference current source for generating a current having a substantially constant current value,
a first capacitor connected at one end to the first reference current source when an input signal is inverted, and
a first amplifier for amplifying a difference between a voltage substantially equal to a reference voltage and a voltage at the one end of the first capacitor until the inversion of the input signal and outputting the difference, the difference increasing as the power supply voltage increases;

a second delay circuit having
a second reference current source for generating a current having a substantially constant current value,
a second capacitor connected at one end to the second reference current source when an input signal is inverted, and
a second amplifier for amplifying a difference between the voltage substantially equal to the reference voltage and a voltage at the one end of the second capacitor and outputting the difference; and an order logic circuit for outputting an order logic of output of the first and second amplifiers and inputting the logic to the first and second delay circuits, wherein the first and second reference current sources comprise:
a reference current generating circuit including
a first MOS transistor having a gate connected to a node having a first potential,
a second MOS transistor having a gate and a drain connected to each other so as to constitute a diode, the gate and the drain being connected to a node having a second potential, and
a resistor connected between a source of the first MOS transistor and the drain of the second MOS transistor; and
a level shifter including
a third MOS transistor applied with the first potential from a power supply through a P-channel MOS transistor load element, the third MOS transistor having a drain and a gate connected to each other so as to constitute a diode, the drain and the gate being connected to the node having the first potential,
a fourth MOS transistor constituted as a diode by connecting a gate and a drain to the source of the third MOS transistor and a source to a drain of a N-channel MOS transistor load element, and
a differential amplifier for controlling the P-channel MOS transistor load element and the N-channel MOS transistor load element by outputting a difference between a reference voltage and a potential at the source of the fourth MOS transistor, and in which
the third and the fourth MOS transistors of the level shifter comprise transistors a total sum of threshold voltages of which is the substantially equal to that of threshold voltages of the first and second MOS transistors of the reference current generating circuit, and generate a reference current in the resistor of the reference current generating circuit in accordance with a voltage applied to the gate of the first MOS transistor.

13. A semiconductor integrated circuit device according to claim 12, wherein the first, second, third, and fourth MOS transistors are formed to have a substantially equal threshold voltage.

14. A semiconductor integrated circuit device according to claim 12, wherein the first, second, third, and fourth MOS transistors are intrinsic type MOS transistors.

* * * * *